US006739886B1

(12) United States Patent
Robinson et al.

(10) Patent No.: US 6,739,886 B1
(45) Date of Patent: May 25, 2004

(54) ELECTRICAL ENCLOSURE OPTICAL COMMUNICATION PORT SEAL

(75) Inventors: Darrell Robinson, Highland, MI (US); Allen V. Pruehs, Howell, MI (US)

(73) Assignee: Ekstrom Industries, Inc., Farmington Hills, MI (US)

( * ) Notice: Subject to any disclaimer, the term of this patent is extended or adjusted under 35 U.S.C. 154(b) by 104 days.

(21) Appl. No.: 10/011,476

(22) Filed: Nov. 5, 2001

Related U.S. Application Data

(60) Provisional application No. 60/270,083, filed on Feb. 20, 2001.

(51) Int. Cl.[7] .................................................. B32B 1/02
(52) U.S. Cl. ........................ 439/133; 324/110; 439/135
(58) Field of Search ............................ 174/67; 439/135, 439/142; 385/58, 75, 76, 77, 94, 134; 324/110; 359/511, 513; 361/672

(56) References Cited

U.S. PATENT DOCUMENTS

| 3,140,344 | A | * | 7/1964 | Slater et al. | |
| 3,845,234 | A | * | 10/1974 | Brenner ........................ | 174/67 |
| 3,989,338 | A | * | 11/1976 | Gosser | |
| 4,491,791 | A | | 1/1985 | Balch et al. | |
| 4,491,792 | A | | 1/1985 | Bullock et al. | |
| 4,491,793 | A | | 1/1985 | Germer et al. | |
| 4,640,575 | A | * | 2/1987 | Dumas | |
| 4,712,861 | A | * | 12/1987 | Lukas .......................... | 358/77 |
| 4,979,634 | A | * | 12/1990 | Begley | |
| 5,003,128 | A | * | 3/1991 | Grondin ...................... | 174/67 |
| 5,027,056 | A | | 6/1991 | Russillo, Jr. et al. | |
| 5,057,767 | A | | 10/1991 | Keturakis et al. | |
| 5,109,452 | A | * | 4/1992 | Selvin et al. | |
| 5,268,633 | A | | 12/1993 | Balch | |
| 5,590,779 | A | * | 1/1997 | Ramsey ................... | 206/459.1 |
| 5,742,512 | A | | 4/1998 | Edge et al. | |
| 5,851,038 | A | | 12/1998 | Robinson et al. | |
| 6,000,856 | A | * | 12/1999 | Yunker ......................... | 385/75 |
| 6,280,805 | B1 | * | 8/2001 | Markovich ................. | 428/34.1 |
| 6,547,444 | B2 | * | 4/2003 | Kiani ........................... | 385/53 |

FOREIGN PATENT DOCUMENTS

JP  2-143170  * 6/1990

OTHER PUBLICATIONS

Optic Guard Protective Cover, Kansas City Power & Light Co., Published May 8, 2001.

* cited by examiner

Primary Examiner—Neil Abrams
(74) Attorney, Agent, or Firm—Young & Basile, PC

(57) ABSTRACT

A cap mountable over an optical port support and a securing member fixedly engagable through the cap to the optical port support. The seal also includes an indicator for indicating separation of the cap from the support. In one aspect, the cap has a base mountable over the support and a plate with a hook pivotally attached to the base. In another aspect, an extension projects from one portion of the cap and includes an aperture aligned with a threaded bore in the cap. An aperture in the shaft of the fastener is alignable with the aperture in the extension to receive a seal indicator. The fastener is provided with a hardened tip for secure engagement with the optical port support. In one aspect, the legs of the fastener are thin so as to be deformable upon the application of a predetermined amount of threading torque to the fastener. In another aspect, a tampering indicator is in the form of a tape applied over the optical port which permanently changes state when removed from the optical port to indicate tampering when reapplied to the optical port.

33 Claims, 9 Drawing Sheets

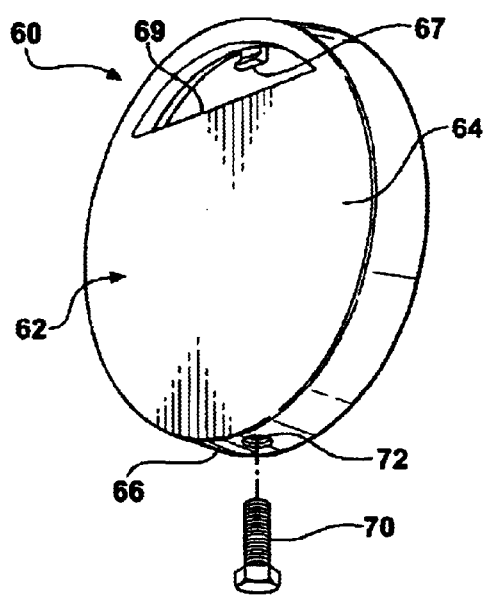
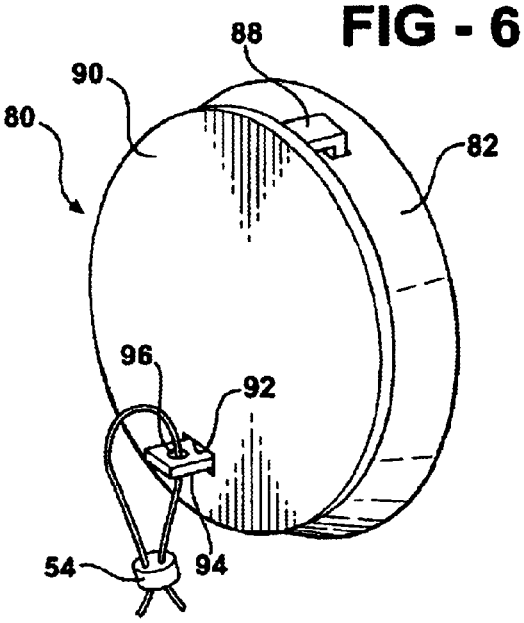
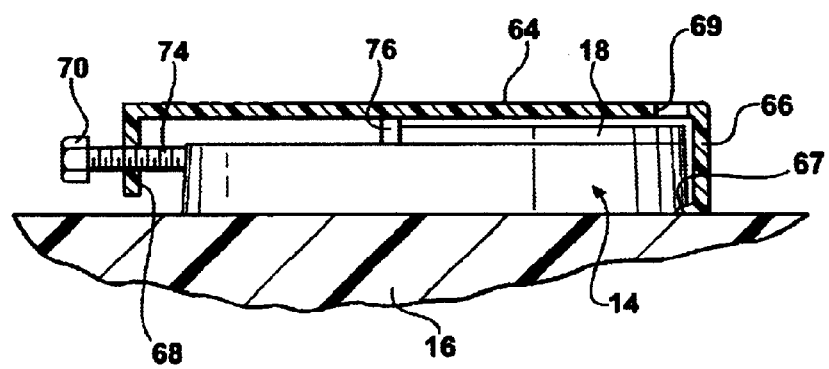
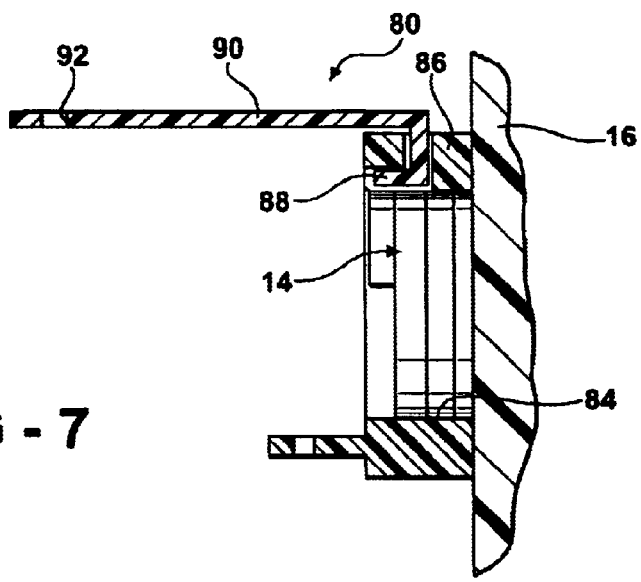

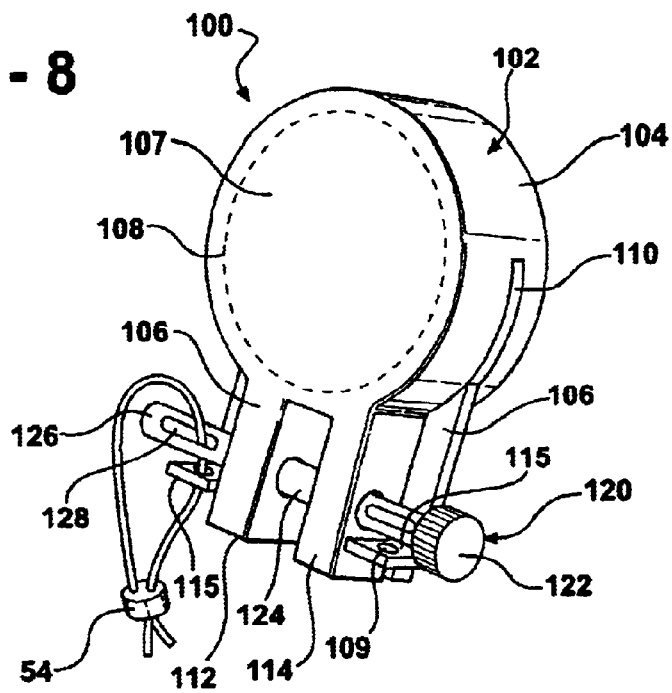
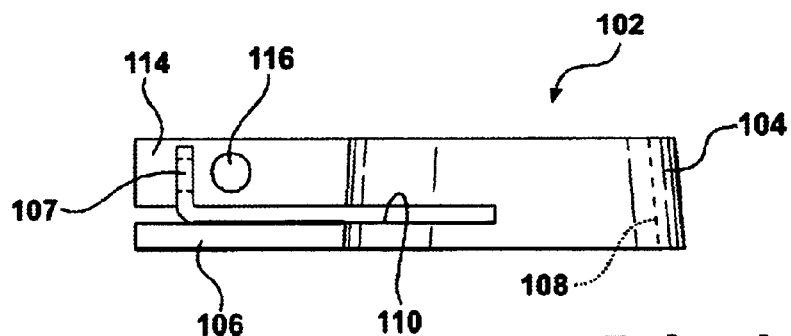
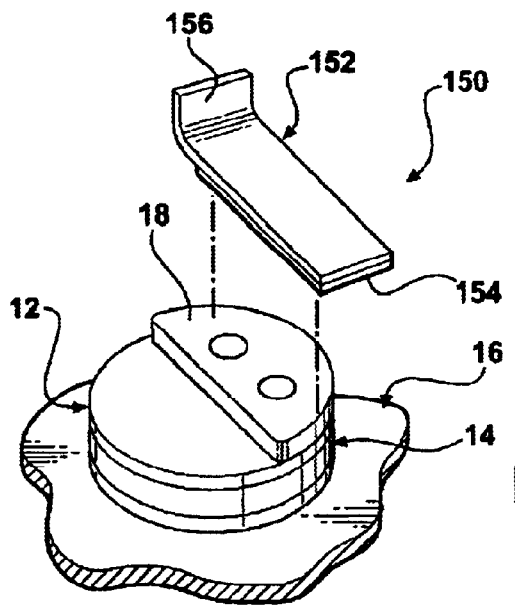

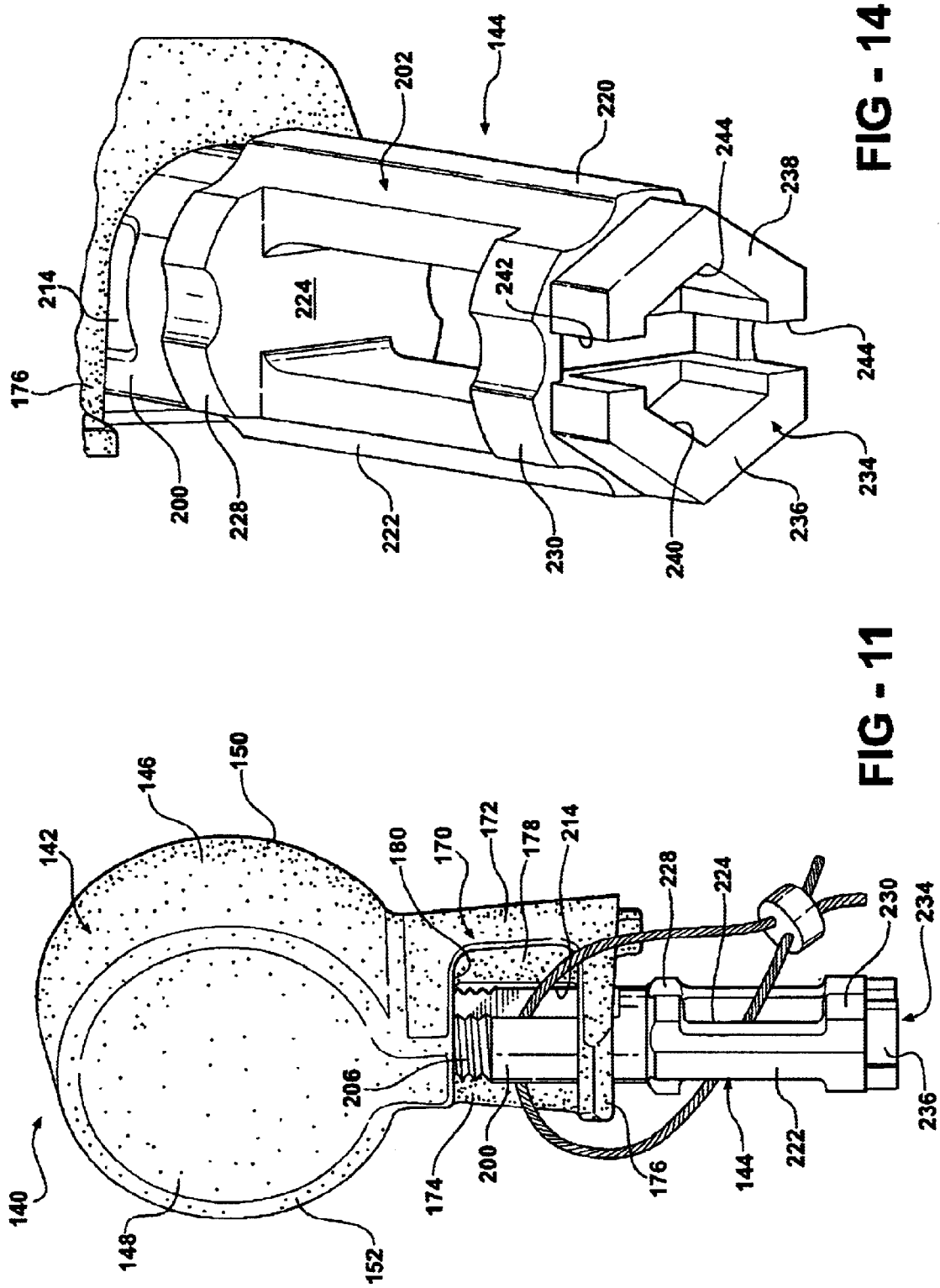

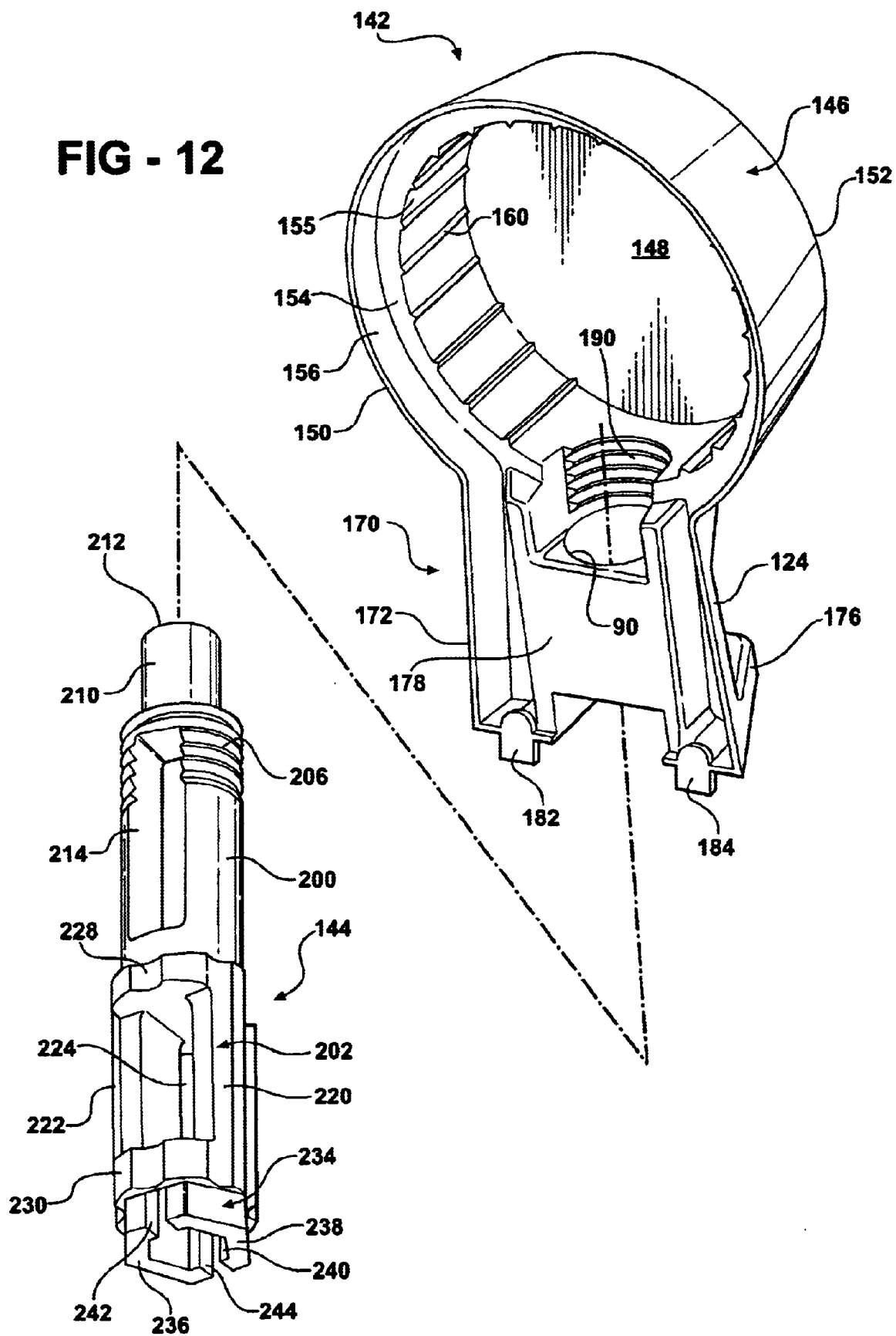

ELECTRICAL ENCLOSURE OPTICAL COMMUNICATION PORT SEAL

CROSS REFERENCE TO CO-PENDING APPLICATION

This application claims the benefit of the Feb. 20, 2001, priority filing date of U.S. provisional patent application Ser. No. 60/270,083, the entire contents of which are incorporated herein in its entirety.

BACKGROUND

Watthour meters are employed to measure the power consumed at a building or residential site. Recent developments have resulted in computerized, electronically programmable watthour meters. These watthour meters are designed to be programmed or reprogrammed at the place of installation, such as the customer residence or a customer building site. In addition, these meters have the capability for electronic readout of metered data, such as total kilowatt hours of consumption, demand kilowatt consumption, and the like.

Programming and reading of electronically programmable watthour meters is normally done by a utility company service person using a portable electronic reader/programing device. This device typically includes an optical adapter which attaches to a mating optical port having a coupler mounted through the meter dome to enable the reader/programmer to communicate with the electronics within the watthour meter.

Such optical parts utilize light receptive photo diodes and light emitting photo diodes which are mounted in a support through the cover or dome of a watthour meter the internal ends of the photo diode receivers and light transmitting photo diodes in the optical port are connected to the internal circuitry within the watthour meter. The adapter on the reader/programmer is attachable to the optical coupler support, typically through magnetic interaction to insure proper alignment of the adapter and coupler. In this manner, the reader/programmer held by the utility service person can communicate with the watthour meter circuitry.

Examples of typical optical couplers employed in watthour meters can be had by referring to U.S. Pat. Nos. 4,491,791; 4,491,792; 4,491,793; 5,742,512; 5,268,633; 5,057,767; and 5,027,056.

While the optical port provides an excellent communication path to allow programming and reading of programmable watthour meters, the optical port itself is subject to several problems. First, the positioning of the optical port on the exterior surface of the meter dome or cover places the optical port in a position for exposure to sunlight. The ultraviolet radiation causes the typically plastic covers over the photo diodes in the optical port to yellow or turn opaque over time thereby interfering with data communication through the optical port.

The exposed optical port also is susceptible to damage through vandalism as well as being easily accessible to unauthorized attempts to communicate with the watthour meter which may result in modification of stored data or stored thresholds, parameters and programs in the watthour meter.

It would be desirable to provide a device which addresses the above-described problems associated with the use of optical ports on electrical enclosures, such as watthour meters. It would also be desirable to provide such a device which is easy to use, does not interfere with data communication through the optical port when the electrical apparatus housed within the electrical enclosure is to be programmed or data is to be output to an external, portable reader/programmer. It would also be desirable to provide such a device which is capable of accepting a standard seal or padlock normally used with watthour meters to provide an indication of tampering with the device or its mounting on the optical port on the electrical enclosure.

SUMMARY

The present invention is an electrical enclosure optical communication port seal which lockingly and sealably covers an optical communication port mounted in a support on an electrical enclosure, such as a watthour meter.

In one aspect, the seal includes a cap having a closed end portion adapted to be mountable over and encompass an optical port support on an electrical enclosure, and means for fixably securing the cap to the optical port support, with the closed end of the cap disclosed over the data communication end of the optical port support. A fastener is threadingly extendable through the cap into fixed engagement with the optical port support.

In another aspect, the seal includes at least one leg projecting from the cap. An aperture is formed in the at least one leg. Separation indicating means are mountable through the apertures in the leg and the fastener to indicate any separation of the cap from the support.

In another aspect, the cap includes a base fixedly disposed over the optical port support and having a through bore providing access to the optical port. A plate having a hooked-shape end is formed as part of the cap. Means are provided for pivotally attaching the hook on the plate to the base such that the plate is movable between a first position space from the base and exposing the optical port to access and a second position where the plate closes the bore in the base and blocks access to the optical port. A seal indicator is attachable to the base in the plate for indicating separation of the plate from the base.

In another aspect, the seal further includes an extension projecting from one portion of the cap. The extension defines a wall portion and a flange projecting from the wall portion. An aperture is formed in the flange aligned with an internally threaded bore formed in the cap. The threaded bore receives the securing means.

In this aspect, the cap further includes a sidewall extending from the closed end portion A shoulder is formed interiorly within the sidewall defining a resilient gasket mounting surface for forming a seal between the cap and a watthour meter. The shoulder optionally defines a thinner sidewall portion on the sidewall extending from the shoulder which is more easily deformable than the portion of the sidewall extending oppositely from the shoulder.

In another aspect, the securing means is in the form of a fastener threadingly extendable into the threaded bore in the cap. Finger grips surfaces may be formed on the fastener to facilitate hand rotation of the fastener. Optionally, an aperture is formed in the fastener for receiving a tool to facilitate rotation of the fastener. Optionally, an end portion of the fastener is formed with a plurality of angularly disposed exterior flats for receiving a tool to facilitate rotation of the fastener. Further, an end portion of the fastener may be formed with a plurality of interior flats opening through the end portion for receiving a tool interiorly within the end portion to facilitate rotation of the fastener. Yet further optionally, an end portion on the fastener is formed with a transversely extending slot, the slot opening through the end portion for receiving a tool to facilitate rotation of the fastener.

In yet another aspect, the securing means is in the form of a fastener having a tip end and a rotative force application end. A threaded portion extends from the tip end for threading engagement with the threads in the cap. A plurality of circumferentially spaced legs connect the threaded portion to the rotative force application end. The legs have a predetermined thickness such that the legs are deformable at a predetermined amount of rotative force applied to the rotative force application end.

In another aspect, the fastener preferably has a hardened tip.

In yet another aspect, an adhesive back strip is mountable over a data communication end of the optical port support. The strip is permanently deformable upon removable from the data communication end to indicate separation from the optical port support.

The optical communication port seal of the present invention address numerous problems associated with the use of optical ports on electrical enclosures, such as watthour meters. The optical communication port seal of the present invention is easy to use, does not interfere with data communication through the optical port when the electrical apparatus housed within the electrical enclosure is to be programmed or data is to be output to an external portable reader/programmer. At the same time, the inventive seal covers the optical port support protecting the optical port support from UV radiation, vandalism, etc. Further, the optical port seal of the present invention is adapted for receiving a standard seal or padlock normally used with watthour meters to provide an indication of tampering with the electrical device itself, or the cap on the optical port.

BRIEF DESCRIPTION OF THE DRAWINGS

The various features, advantages and other uses of the present invention will become more apparent by referring to the following detailed description and drawing in which:

FIG. 4 is a perspective view of another aspect of an optical port seal according to the present invention;

FIG. 5 is a cross-sectional view of the seal shown in FIG. 4;

FIG. 6 is a perspective view of an optical port seal according to another aspect of the present invention shown in a closed position;

FIG. 7 is a side elevational view of the optical port seal of FIG. 6 shown in an open position;

FIG. 8 is a perspective view of another aspect of an optical port seal according to the present invention depicted in a closed position;

FIG. 9 is a side-elevational view of the seal shown in FIG. 8;

FIG. 10 is an exploded, perspective view of another aspect of an optical port seal according to the present invention;

FIG. 11 is a front perspective view of an alternate optical port seal according to another aspect of the present invention;

FIG. 12 is an exploded, rear, perspective view of the seal shown in FIG. 11;

FIG. 14 is an enlarged, bottom perspective view of the fastener of the optical port seal shown in FIGS. 11–13;

DETAILED DESCRIPTION

Figure 1:
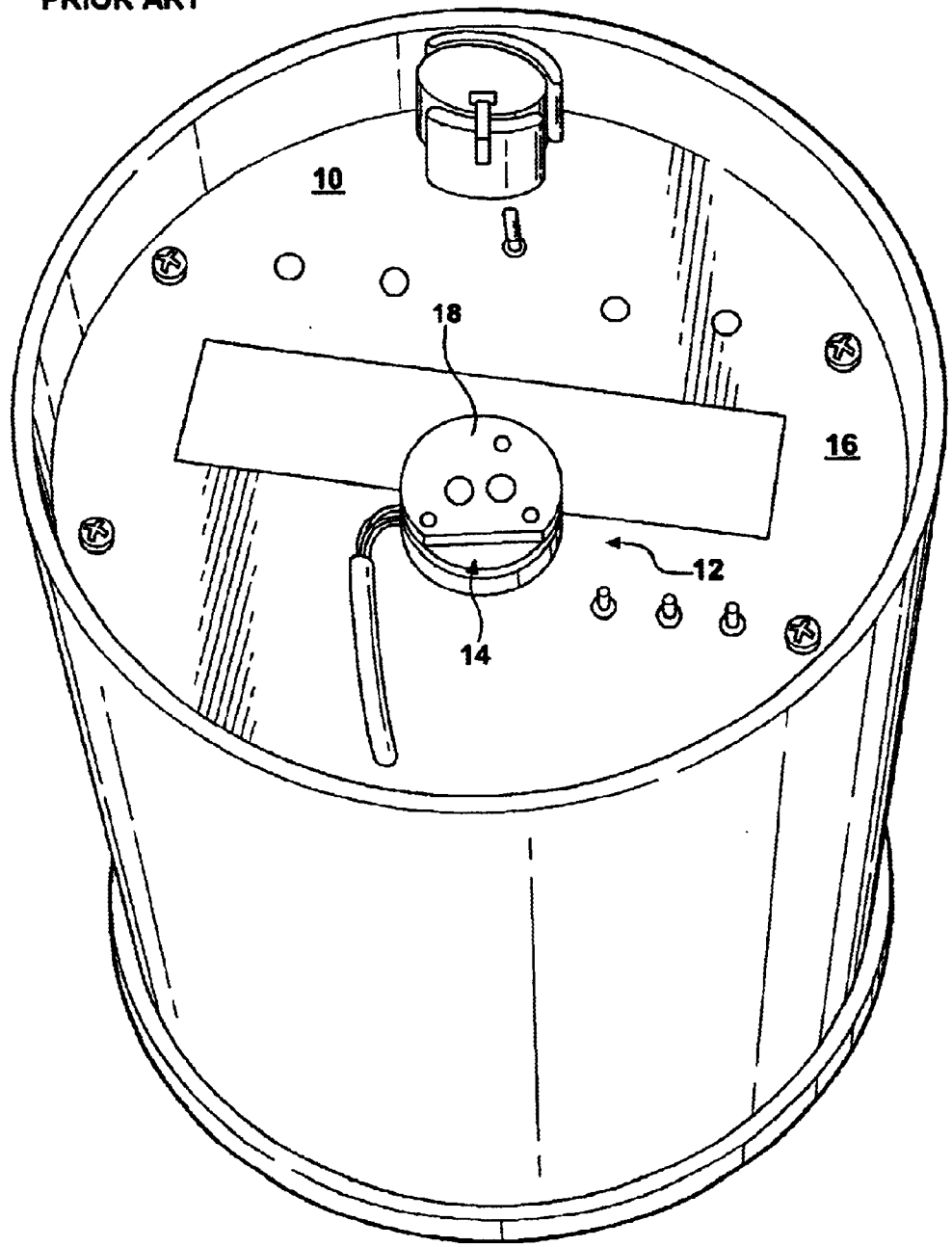
FIG. 1 is perspective view of a prior art watthour meter having an optical coupler mounted thereon.

Referring now to FIG. 1, there is depicted a conventional prior art watthour meter 10 which is used to measure electric power at a business or residential site. The watthour meter 10 is of the electronic type containing an optical data communication port 12. The optical port 12 includes an optical coupler 14 in the form of a cylindrical-shaped support which is mounted on the dome or cover 16 of the watthour meter 10. The cylindrical optical coupler 14 projects through the dome 16 and is connected internally within the dome 10 to the electronic circuit of the watthour meter 10 in a conventional manner.

Typically, the optical coupler 14 is designed for magnetic engagement with a remote programmer/reader mating optical adapter, not shown. Thus, a metal plate 18 is mounted on the coupler 14. The plate 18 includes two apertures which align with bores in the coupler 14 which contain a photo diode and a photo transmitter diode for data communication with the remote programmer/reader.

As the coupling of the remote optical adapter to the coupler 14 and the description of the connection and operation of the programmer/reader to program the various functions in the watthour meter 10 as well as to read output data from the watthour meter 10, such as total kilowatt hours is conventional and well-described in prior patents, such details will not be described herein.

According to the present invention, a unique optical port seal is provided for covering the exposed portions of the optical coupler 14 from vandalism, damage, unauthorized tampering, ultraviolet sunlight radiation, etc.

Figure 3:
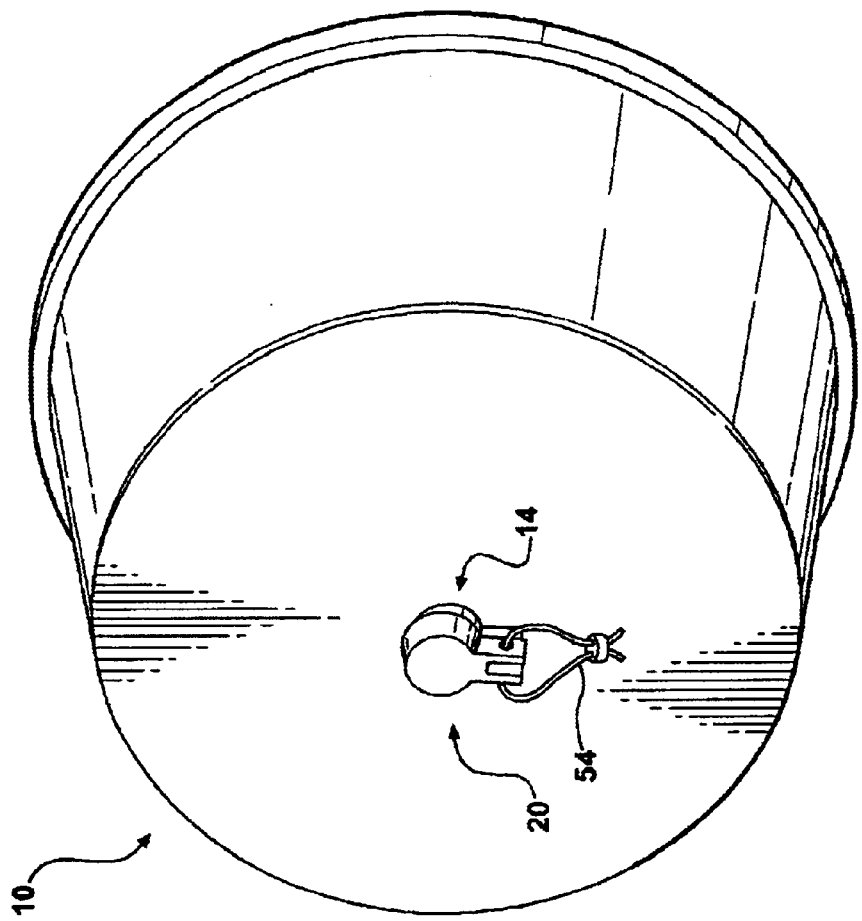
FIG. 3 is a perspective view showing the mounting of the optical port seal shown in FIG. 2 on the optical port on the watthour meter shown in FIG. 1.
Figure 2:
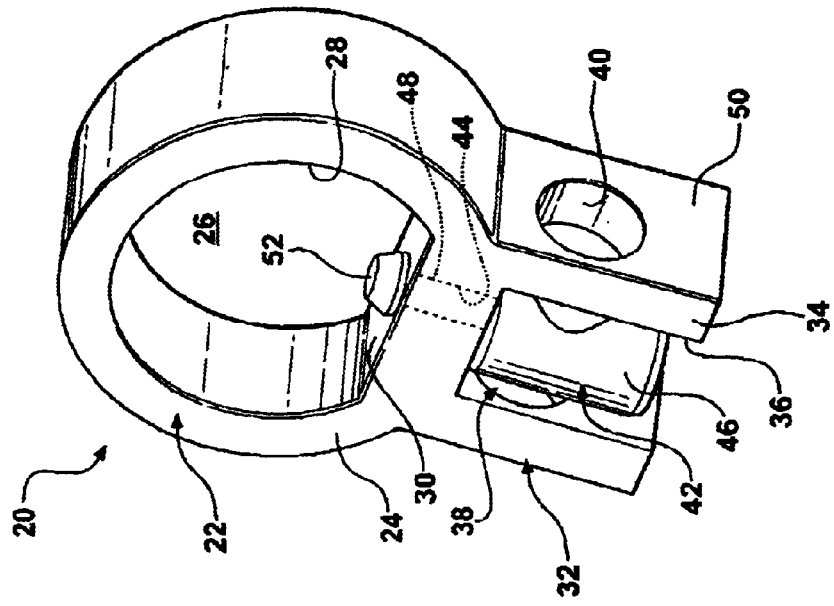
FIG. 2 is a rear perspective view of one aspect of an optical port seal according to the present invention.

One aspect of an optical port cover 20 is shown in FIGS. 2 and 3. The cover 20 is formed of an opaque material, such as plastic, metal, etc., with plastic material being preferred for its resistance to corrosion. The cover includes a cap portion 22 having a generally cylindrical sidewall 24, a closed end wall 26, and an opposed open end 28. For mating with the metal plate 18 on the optical coupler 14 on the watthour meter 10, one portion of the open end 28 in the cover 20 is formed with a flat 30 mating with the similarly formed flat on the metal plate 18 on the optical coupler 14. It will be understood that the open end 28 may be in the form of a generally circular opening if the outer end surface of the optical coupler 14 also has a circular cross-section.

The inner surface of the sidewall 24 maybe be tapered to aid in centering the cap 20 over the optical port support 14.

A pair of legs 32 and 34 project from the sidewall 24 of the cap 22 and define an opening or space 36 there between. Bores 38 and 40 are formed in each of the legs 32 and 34, respectively. The bores 38 and 40 are coaxially aligned as shown in FIG. 2.

A securing device, such as a threaded fastener 42, is threadingly engaged with the threaded bore 44 formed in the sidewall 24 of the cap 22, between the two legs 32 and 34 and opening to the opening 36 between the legs 32 and 34. The fastener 42 is formed with a cylindrical end portion 46 and a threaded shank 48. A through bore 50 is (by example only) formed in the cylindrical end portion 46 and is alignable with the bores 38 and 40 in the legs 32 and 34, respectively, of the cap 22. The bores 32, 34 and 50 receive an optional seal indicator device 54, such as a wire/cable seal or a plastic padlock conventionally used with sealing rings used to mount watthour meters to a ring-style socket cover or socket adapter/extender to indicate separation of the sealing ring from the meter or adapter.

In use as shown in FIG. 3, the cover 20 is oriented such that the open end 28 is disposable over the cylindrical coupler 14 on the cover or dome 16 of the watthour meter 10. In this orientation, the closed end 26 of the cover 20 completely closes off the bores in the metal plate 18 which are aligned with the photo receiver and photo transmitter diodes mounted in the optical port 12. The fastener 42 is then threadingly advanced through the bore 44 until an end 52 of the threaded shank 48 of the fastener 42 securely engages the sidewall 24 of the coupler element 14 locking the cover 20 in place over the coupler element 14. The wire seal 54 is then be inserted through the aligned bores 32, 34, and 50 in the cover 20 to provide an indication of a sealed mounting of the cover 20 on the optical coupler 14. Any breakage of the seal 54 provides an indication of tampering with the optical coupler 14.

When the utility company service person wishes to communicate with the watthour meter 10 to reprogram various meter functions and/or to readout the accumulated power consumption totals, the service person removes the wire seal 54, loosens the fastener 42 and removes the cover 20 from the optical port 14. At the conclusion of data communication, the utility service person removes the optical adapter from the optical coupler 14, replaces the cover 20 over the optical coupler 14, tightens the fastener 42 to secure by engage the cover 20 to the optical coupler 14 and reapplies a new wire seal 54 to the cover 20.

Referring now to FIGS. 4 and 5, there is depicted another aspect of a cover 60 according to the present invention In this aspect of the invention, the cover 60, like the cover 20 described above, is formed of a corrosion resistant material, such as a plastic. The cover 60 also includes a cap portion 62 having a closed end 64, a side wall 66, and an open end 68 opposed from the closed end 64. A threaded fastener 70, such as a set screw, is threadingly insertable through a threaded bore 72 in the sidewall 66 to enable an end 74 of the fastener 70 to securely engage a side portion of the support of the optical coupler element 14. This locks the cap 62 to the optical coupler 14.

As shown in FIG. 5, at least one internal rib 76, step, or pin may be formed on the inner surface of the closed end 64 to engage the flat on the metal plate 18 of the optical coupler 14 to prevent rotation of the cap 62. In the case of ribs or pins, two spaced ribs or pins, extending from the inner surface of the closed end 64 are preferably employed.

A projection 67 is formed at a bottom end of one portion of the sidewall 66 of the cover 60, such as diametrically opposed from the bore which receives the fastener 70. The projection 67 is designed to forcibly engage the optical coupler 14 when the cover 60 is securely mounted on the optical port 14 via the threaded fastener or set screw 70. Threading advance of the fastener 70 through the bore 72 in the cover 60 pulls the entire cover 60 to the left, in the orientation shown in FIG. 5, to advance the end of the projection 67 into forcible engagement with the optical coupler 14.

In order to form the projection 67 during the molding of the cover 60, an aperture 69 is required in one end portion of the closed end 64 of the cap 62. The aperture 69 allows a slide in the molding die to advance through the closed end 64 and form the projection 67 unitarily at one end of the sidewall 66. It will be noted that the aperture 69 in the closed end 64 of the cap 62 is spaced from the bores in the plate 18 on the optical coupler 14 when the cap 60 is mounted to the optical coupler 14.

The installation and removal of the cover 60 is the same as that described above for the cover 20.

Another aspect of the cover of the present invention is shown in FIGS. 6 and 7. In this aspect of the invention, a cover 80 includes a base 82 having a circular or other exterior peripheral shape and a generally cylindrical through bore 84. The base 82 is adapted to be fixedly mounted to the dome 18 of the watthour meter 10 surrounding the periphery of the optical coupler 14.

An opening 86 is formed in the base 82 and receives a hook-shaped end portion 88 of a disk-shaped cap or plate 90. The end portion 88 allows the plate 90 to pivot relative to the base 82 between a first, open position spaced from the base 82 as shown in FIG. 6 and a second, closed position in which the plate 90 overlays and closes off the bore 84 in the base 82.

An aperture 92 is formed near the periphery of the plate 90 and is adapted to slide over an arm 94 projecting from a diametrically opposed portion of the base 82. A through bore 96 is formed in the arm 94. When the plate 90 is in the second position with the aperture 92 disposed over the arm 94, a wire seal such as the wire seal 54, may be inserted through the bore 96 in the arm 94 to seal the plate 90 in the second closed position.

However, it can be seen that the wire seal 84 may be easily removed by a utility company service person, and the plate 90 pivoted to the first open position allowing insertion of the remote programmer/reader coupler element through the bore 84 in the base 82 into secure engagement with the optical coupler 14 mounted on the dome 16 of the watthour meter 10 for data communication there between. After the data communication process is complete and the adapter disengaged from the optical coupler 14, the plate 90 is pivoted to the second closed position and a new wire seal 54 inserted through the bore 96 in the arm 94.

FIGS. 8 and 9 depict yet another aspect of a cover 100 according to the present invention. In this aspect of the invention, the cover 100 includes a cap portion 102 formed of a sidewall 104, a flat plate 106, and an opposed cap 108 having a closed end wall 107. A slot 110 is formed through a portion of the sidewall 104 of the cap 102. The slot 110 extends completely through a portion of the sidewall 104 to form the flat plate 106 on one side of the slot 110 and a movable portion on the opposite side. The ends of the flat plate 106 are bent outward to form two flanges 115, each having an aperture 109, therethrough.

The movable portion of the sidewall 104 is formed with two arms 112 and 114 which are integrally formed with the sidewall 104 and are bent radially outward from the sidewall 104 or provided as separate elements secured to or molded as part of the sidewall 104. Coaxial apertures 116 are formed in each of the arms 112 and 114 and are adapted to receive a fastener 120. Both of the apertures 116 are threaded to enable a threaded portion on the fastener 120 to pull the arms 112 and 114 together into contact or close proximity to securely tighten the sidewall 104 about the circumference of optical coupler 14 or, when the fastener 120 is rotated in an opposite direction, to enable the arms 112 and 114 to spring apart due to the inherent resiliency of the material preferably forming in the cap 102, thereby loosening the cap 102 relative to the optical coupler 14 to enable the cap 102 to be removed from the optical coupler 14.

The fastener 120 may be a conventional fastener having a head 122 and a shank portion 124 with threads. Alternately, the fastener 120 may be a fastener disclosed in U.S. Pat. No. 5,851,038 which is used in a watthour meter sealing ring. This type of fastener 120 also includes the head portion 122, a shank portion 124 with threaded and unthreaded portions, and an end portion 126 having an aperture or slot 128 formed therein.

The aperture 128 in the fastener 120 and an aperture 109 in one of the flanges 115 receives a wire seal 54 which prevents unthreading of the fastener 120 to unauthorizedly enable removal of the cap 102 from the optical coupler element 14.

However, it is easy for a utility company service person to remove the wire seal 54, unthread the fastener 120 sufficiently to enable the cover 100 to be removed from the optical coupler. At the completion of the data communication procedure, the cover 100 is reinstalled over the optical coupler 14 and the fastener 120 tightened to bring the sidewall 104 of the cap 102 into tight engagement with the optical coupler 14. A new seal 54 is then inserted through the aperture 128 in the fastener 120.

Referring now to FIG. 10, there is depicted another aspect of an optical port cover 150 according to the present invention. In this aspect, the cover 150 is in the form of a strip-like member 152 which is securely mountable over the bores in the plate 18 on the optical port 12 so as to block access to the optical communication circuitry in the watthour meter through the bores in the plate 18. The strip 152 is of a sufficient size to completely cover the bores in the plate 18. Further, the strip 152 is preferably formed of an opaque or solid material so as to completely cover the bores in the plate 18 from view and to block ultraviolet sunlight radiation from affecting the transparent plastic discs normally disposed over the bores in the plate 18.

The strip 152 is securely attachable to the plate 18 by suitable means. In a preferred aspect, the strip 152 carries an adhesive backing 154 so as to be easily adhesively mounted over the bores in the plate 18. A flexible tab 156 extends from the strip 152 and is free of any adhesive. The tab 152 functions as a finger grippable member which enables a utility service person to remove the strip 152 from the plate 18 as well as to conveniently handle the strip 152 when applying it to the plate 18.

The adhesive 154 covers substantially all of one entire surface, such as the back surface of the strip 152 in the orientation shown in FIG. 10, except for an end portion or tab 156. The adhesive 154 may also be applied on the back surface of the strip 152 only about the peripheral edges so as not to have adhesive disposed over the bores in the plate 18 when the strip 152 is mounted on the plate 18.

In a preferred aspect of the invention, the strip 152 is constructed so as to be deformable in some manner when removed from the plate 18. The deformation may take a variety of forms, such as the formation of permanent creases in the strip 152 which are easily visible in the strip 152 to provide an indication of tampering with the strip 152 through an unauthorized removal from the plate 18. The strip 152 may also be formed to break into small pieces when removed from the plate 18. Alternately, the strip 152 may be formed of a multilayer stack of individual layers, one of which remains, in whole or in part, adhesively attached to the plate 18 when the remaining layer or layers of the strip 152 are removed from the plate 18. This again provides a visible indication of removal of the strip 152.

In a preferred aspect of the invention, the strip 152 can be one sold by E.J. Brooks Company of Livingston, N.J. This strip material, after being adhesively applied to a surface, separates into multiple layers upon removal and forms visible letters which may be words, such as "void open", etc.

In use, an authorized utility service person will apply the strip 152 over the bores in the plate 18. When the service person next approaches the meter for data communication with the internal circuitry of the meter via the optical port 12, the service person grabs the tab 156 and pulls the strip 152 away from the bores in the plate 18. The optical adapter may then be attached to the optical port 12 to implement data communication to the bores in the plate 18.

After the data communication process is completed, the service person removes the optical adapter from the optical port 12 and applies a new strip 152 over the bores in the plate 18.

Another aspect of an optical port cover 140 according to the present invention is shown in FIGS. 11–15.

The optical port cover 140 includes a cover 142 and a fastener 144. The cover 142 has a hollow configuration formed of a sidewall 146, a front wall 148 and a hollow interior opening rearward of the front wall 148 as shown in FIG. 12. The I.D. of the sidewall 146 forming the internal chamber within the cover 142 is sized to be slightly greater than the O.D. of the optical port 14 on the watthour meter 10 so as to enable the interior chamber in the cover 142 to completely cover the entire external surface of the optical port 14.

As shown in FIGS. 11 and 12, the sidewall 142 has a rear edge 150 and an opposed front edge 152 which defines the periphery of the front wall 148. A shoulder 154 is formed interiorly on the sidewall 146 at a spaced distance from the rear edge 150. The shoulder 154 forms one edge of an increased thickness portion of the sidewall 146 which extends from the shoulder 154 to the front edge 152 of the sidewall 146. The shoulder 154 also defines one end of a reduced thickness portion 156 extending from the rear edge 150.

The sidewall 146 has a tapered shape extending from a larger diameter portion along the rear edge 150 to a smaller diameter portion along the front edge 152. This tapered surface, i.e., 10°–15°, for example, makes it difficult for a tool, such as a wrench, channel locks, etc., to be secured over the sidewall 146 in an unauthorized attempt to remove the cover 142 from the optical port 14. In addition, the reduced thickness portion 156 of the sidewall 146 will easily deform and form a non-smooth surface with wrinkles, etc., if an attempt is made to pry the cover 142 from the optical port 14 or to secure a tool about the sidewall 146.

The increased thickness portion 155 carries a plurality of radially inward extending, thin projections or ribs 160 which preferably have a sharp apex at the radial innermost end. The ribs 160 dig into the relatively softer exterior portion of the optical port 14 to assist in securely affixing the optical port cover 142 to the optical port 14.

Figure 13:
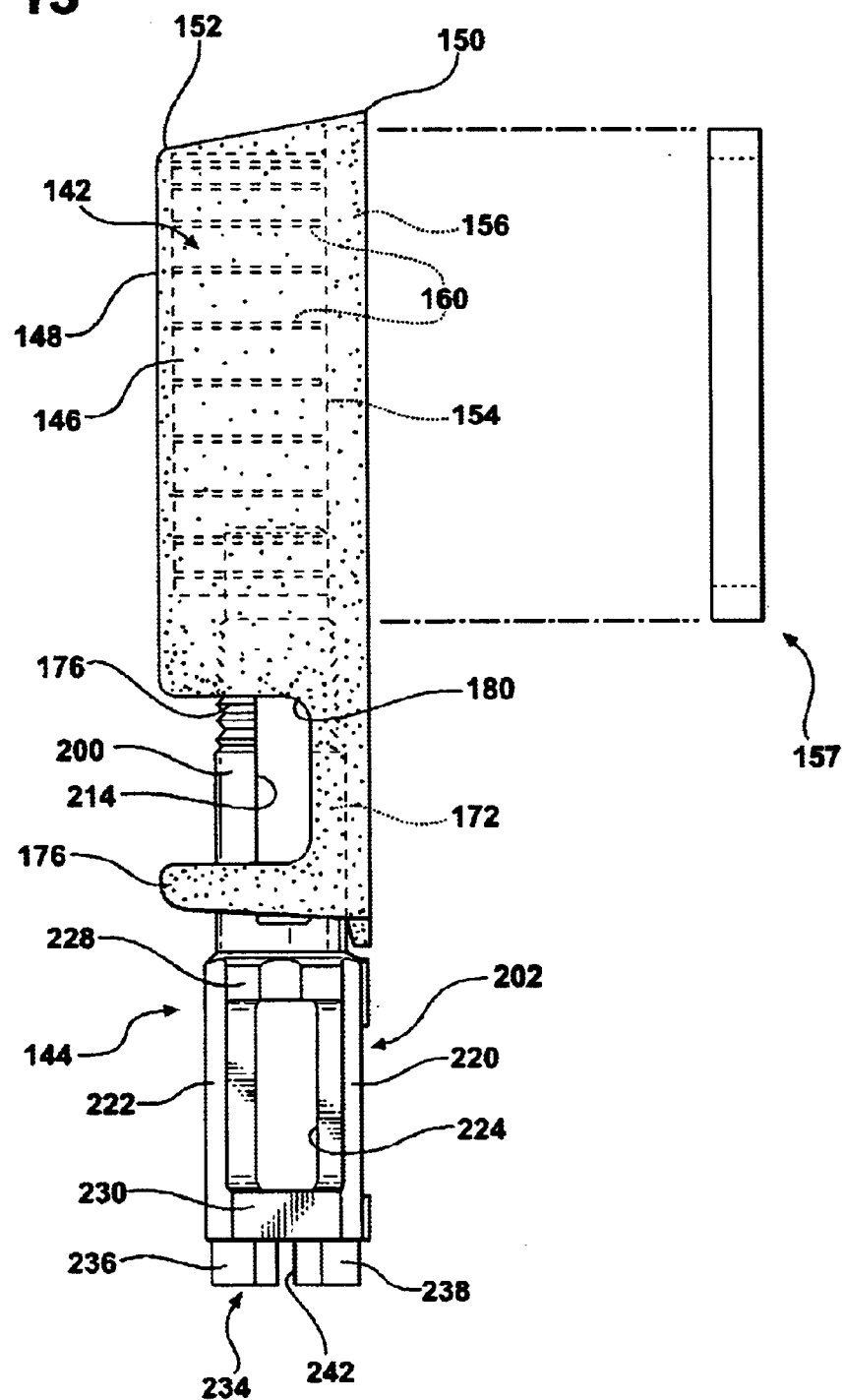
FIG. 13 is a partially exploded, side elevational view of the seal shown in FIG. 11.

A seal member or resilient gasket 157 of a generally annular shape is mounted on the shoulder 154 as shown in FIG. 13. The member 157 is preferably formed of a soft durometer, compressible rubber or other similar material so as to be compressed by the front surface of the watthour meter 10 when the cover 142 is mounted over the optical port 14 to seal the interior cavity of the cover 142. The member 157 can be adhesively attached to the shoulder 157, for example.

An extension 170 projects from one portion of the cover 142. The extension 170 includes a pair of legs 172 and 174 and a lower, U-shaped, cross piece 176. A rear wall 178 extends between inner surfaces of the legs 172 and 174 rearward of an inner edge of the cross piece 176. As shown in FIGS. 11 and 13, a cavity 180 is thus formed between the lower portion of the sidewall 146, the cross piece 176 and the legs 172 and 174, the front edges of which legs 172 and 174 are spaced rearwardly from the front edge 152 of the sidewall 146 as shown in FIG. 13.

As shown in FIG. 12, each leg 172 and 174 has a hollow interior formed by opposed sidewalls and a bottom edge 182 and 184, respectively. The shape of the bottom edge 182 and 184 is shown by example only due to the one piece die cast construction of the cover 142 and the fastener 144 described hereafter. It will be understood that the bottom edges 182 and 184 of the legs 172 and 174 may take other shapes.

The hollow construction of the legs 172 and 174 forms the opposed sidewalls of the legs 172 and 174 with a thin cross section which will again display surface wrinkles or tears if force is exerted on the legs 172 and 174 in an unauthorized attempt to remove a fully secured cover 140 from the optical port 14.

Finally, as shown in FIGS. 12 and 13, one portion of the sidewall 146 and the extension 170 in-between the legs 172 and 174 and disposed generally over the open center of the cross piece 176 is formed with a plurality of interior threads 190. The opposed or front surface 192 of the rear wall 178 is formed with an arcuate shape. The front surface 192 and the threaded portion 190 on the cover 142 form an opening through which the threaded portion of the fastener 144 extends. For assembly purposes and to reduce the cost of the cover 142, the threads 190 are molded or cast into the sidewall 146 during the formation of the cover 142 thereby eliminating a need for a separate machining or tapping operation to form the threads.

The fastener 144 shown in FIGS. 11–15 is preferably formed of a one piece molded or cast construction, such as a metal die casting. The fastener 144 has a tubular shape formed of a shaft portion 200 and a hand or tool engaging portion 202. The shaft portion 200 is formed with a plurality of external threads 206 which threadingly engage the internal threads 190 in the cover 142 to extend and retract the fastener 144 through the threads 190 in the sidewall 146, depending upon the direction of rotation of the engaging portion 202. A tip or nose 210 is formed at one end of the shaft 200. The tip 202 may have a pointed or rounded end 212 for fixed engagement with a sidewall of the optical port 14 in the same manner as described above for the previous optical port covers of the present invention. A transversely extending, through aperture 214 is formed in the shaft 200, the purpose of which will be described hereafter.

Figure 17:
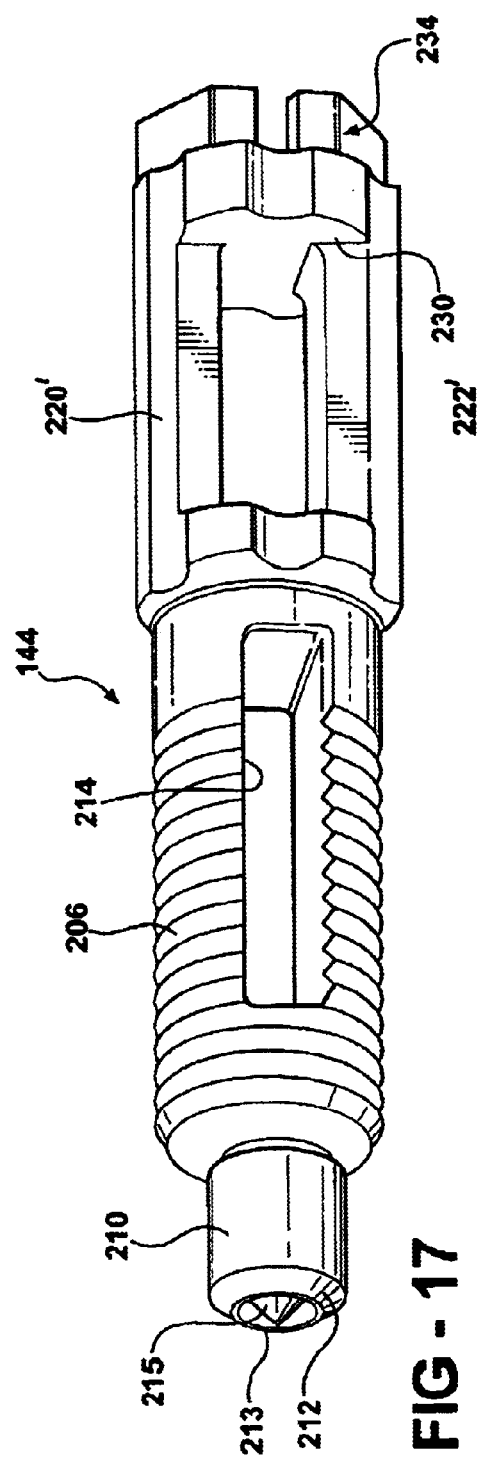
FIG. 17 is a perspective view of an alternate aspect of the fastener of the optical port seal of the present invention.

Another aspect of the fastener is shown in FIG. 17 wherein substantially all of the fastener 144 is substantially the same with only two modifications.

The first modification is to the tip 210 wherein the end 212 has a cylindrical shape extending to a sharp annular edge 213. A hardened tip 215 is fixedly mounted within a recess formed within the edge 213. In a preferred embodiment, the hardened tip 215 is in the form of a set screw which is fixedly mounted within the recess formed within an extending longitudinally inward from the edge 213. The hardened tip 215 has an apex which extends outward a small distance, such as 0.015 inches, beyond the edge 213 of the end 212 of the tip 210, so as to contact the optical port coupler 14 first when the fastener 144 is threaded into the extension 170.

The hardened tip 215 extends out a short distance beyond the edge 213 so as to grip or penetrate a steel optical port coupler 14. Continued threading of the fastener 144 after the tip 215 has contacted the outer surface of the optical port coupler 14 will bring the edge 213 into secure contact with the optical port coupler 14. The hardened tip 215 is sufficiently strong to dig into the optical port coupler 14 a short distance to prevent sideways movement of the edge 213 of the fastener 144 relative to the optical port coupler 14. Engagement of the edge 213 with the steel surface of the optical port will prevent further threading of the fastener 144 and securely mount the cover 20 on the optical port 12. In the case of a plastic optical port 12 having a metallic or steel cover plate, the tip 215 is designed to penetrate the steel plate only a short distance and not extend any significant distance into the underlying plastic portion of the optical port coupler 14 so as to prevent separation of the typically adhesively joined steel plate and plastic optical port coupler 14.

Figure 15:
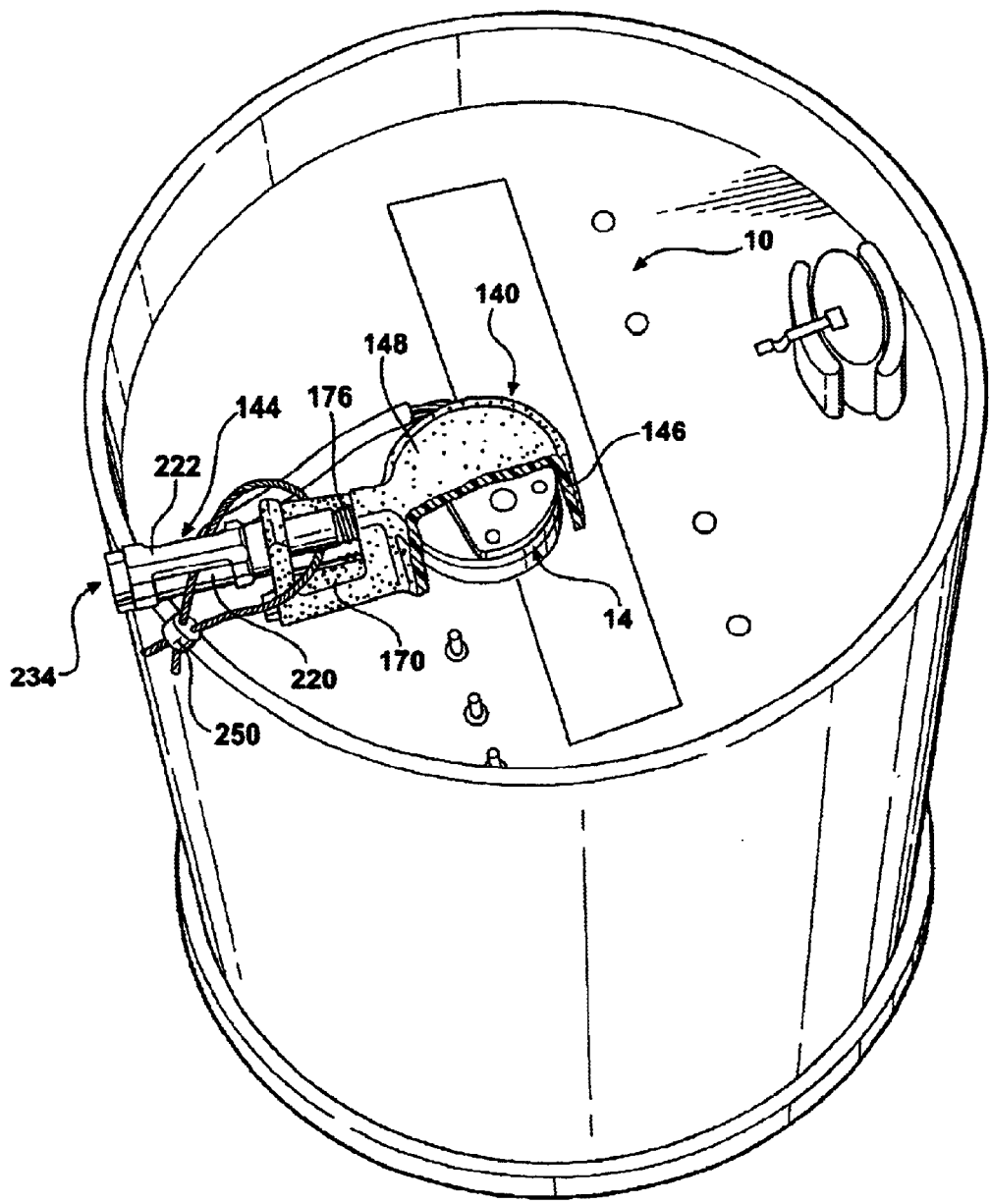
FIG. 15 is a partially broken away, perspective view showing the optical port seal depicted in FIGS. 11–14 mounted on an optical port of an electrical enclosure.

The engaging portion 202 is normally disposed external of the cross piece 176 on the cover 142 as shown in FIGS. 11, 13 and 15. The engaging portion 202 is formed with two longitudinally extending legs 220 and 222 which are disposed on opposite sides of a transverse through bore 224. A longitudinal bore 226 extends through the engaging portion 202 to the juncture of the engaging portion 202 and the shaft portion 200.

In a second modification of the fastener 144 of the present invention, shown in FIG. 17, the legs 220' and 222', which are typically formed of die cast zinc, are designed with a predetermined thickness so as to be able to begin to twist or bend when a predetermined amount of torque is imparted to the fastener 144 by an insertion tool, as described hereafter, after the hardened tip 215 has engaged the optical port coupler 14. This will provide an immediate indication that the fastener 144 has been fully threaded into secure engagement with the optical port coupler 14. As shown in FIG. 17, the legs 220' and 222' are much thinner in thickness than the legs 220 and 222 shown in the aspect of the invention depicted in FIG. 13. The actual thickness of the legs 220' and 222' can be chosen depending upon the material used to form the fastener 144 and the predetermined maximum amount of torque the designer wishes to apply to the optical port coupler 14 through the fastener 144.

By way of example only, the legs 220' and 222' are formed with a predetermined thickness so as to begin to twist or bend upon 20–25 inch/pounds of torque exerted on a tool used to thread the fastener 144 through the extension 170 into engagement with the optical port coupler 14.

At least one and preferably two knurled or faceted surfaces 228 and 230 are formed on opposite axial ends of the legs 220 and 222. The surfaces 228 and 230 form a finger grip surface for hand rotation of the fastener 144.

A tool receiver 234 is formed at one end of the legs 220 and 222. The tool receiver 234 is formed with two opposed walls 236 and 238 which generally define hex-shaped flats on an exterior surface thereof. This enables a wrench to be disposed about the exterior surface of the walls 236 and 238 for rotation of the fastener 144. At the same time, the interior surfaces of the walls 236 and 238 are also formed with hex flats 240 for receiving an Allen wrench, again for rotation of the fastener 144. Further, the walls 236 and 238 are spaced apart to form opposed slots 242 and 244 between spaced ends of the walls 236 and 238 for the insertion of a thin blade or tool, such as a screwdriver therethrough, again for rotation of the fastener 144.

Thus, the fastener 144 includes multiple tool or hand engaging surfaces for enabling rotation of the fastener 144 by different means. The entire exterior surface of the legs 220 and 222 may be gripped by a utility serviceperson's fingers or a tool. At the same time, a blade, such as a screwdriver blade, can be inserted into the transverse bore 224 between the legs 220 and 222 for rotation of the fastener 144. The finger grip surfaces 228 and 230 provide another means for rotating the fastener 114. Finally, the end portion 234 provides three different interior and exterior tool engaging surfaces for rotation of the fastener 144.

In operation, the tip 210 will be initially inserted past the threads 190 in the cover 142 until the threads 206 on the fastener 144 partially engage the threads 190 to retain the fastener 144 in the cover 142.

The cover 142 is then disposed over the watthour meter optical port 14 as shown in FIG. 15. The fastener 144 is then rotated by one of the means described above in a direction to extend the fastener 144 into the interior cavity within the cover 142 until the end 212 of the tip 210 is in tight engagement with a sidewall of the optical port 14.

During the final rotational movements of the fastener 144, the tightening engagement of the tip 210 with the sidewall of the optical port 14 will shift the cover 142 toward the fastener 144 bringing the ribs 160 on the interior portion of sidewall 146 into deformable engagement with the sidewall of the optical port 14. Since at least a portion of the optical port 14 is formed of a metal for engagement with an optical sensor, the ribs 160 dig into the metal disk on the optical port 14 to aid in secure engagement of the cover 142 with the optical port 14 and to resist any relative rotation between the optical port 14 and the cover 142.

As shown in FIG. 15, with the fastener 144 tightly threaded into the cover 142 to bring the cover 142 into fixed, secure, non-rotative engagement with the optical port 14, a seal indicator, such as a wire seal or padlock 250, such as one sold by E.J. Brooks Company of Livingston, N.J., may be inserted through the transverse extending bore 214 in the fastener 144 inside of the cross piece 176, the legs 172 and 174 of the extension 170, and the sidewall 146 of the cover 142. The wire seal 250, as is conventional, provides an indication of a secure cover 142 installation as well as any attempt to remove the cover 142 which will be evidenced by removal of and/or damage to the seal 250.

The wire seal 250 prevents removal of fastener 144 from the cover 142, as well as inhibiting rotation of the fastener 144, as the wire seal 250 will engage the legs 172 and 174 after only a slight amount of rotation of the fastener 144.

As mentioned previously, the fastener 144 may be integrally molded or cast with the cover 142 in a one piece assembly and then broken or separated from the cover 142 for use as described above. The enlarged portions 182 and 184 on the legs 172 and 174 of the extension 170 of the cover 142, shown in FIG. 12, form gates or runners in the die to allow metal flow into a cavity to form the fastener 144.

Although the optical communication port seal of the present invention, as described above in various aspects, has been illustrated and depicted as being used with an optical port mounted on the dome of a watthour meter, due to the different mounting locations of such optical ports, the optical communication port seal of the present invention is more broadly employable with optical ports mounted on any type of enclosure, particularly electrical enclosures. The use of the term "electrical enclosure" will be understood to include any type of enclosure, whether containing electrical components, electrical wires, cables, conductors, or merely providing a base or support for an optical port coupler which is connected to communication circuitry or devices in an electrical use device, such as a watthour meter.

Figure 16:
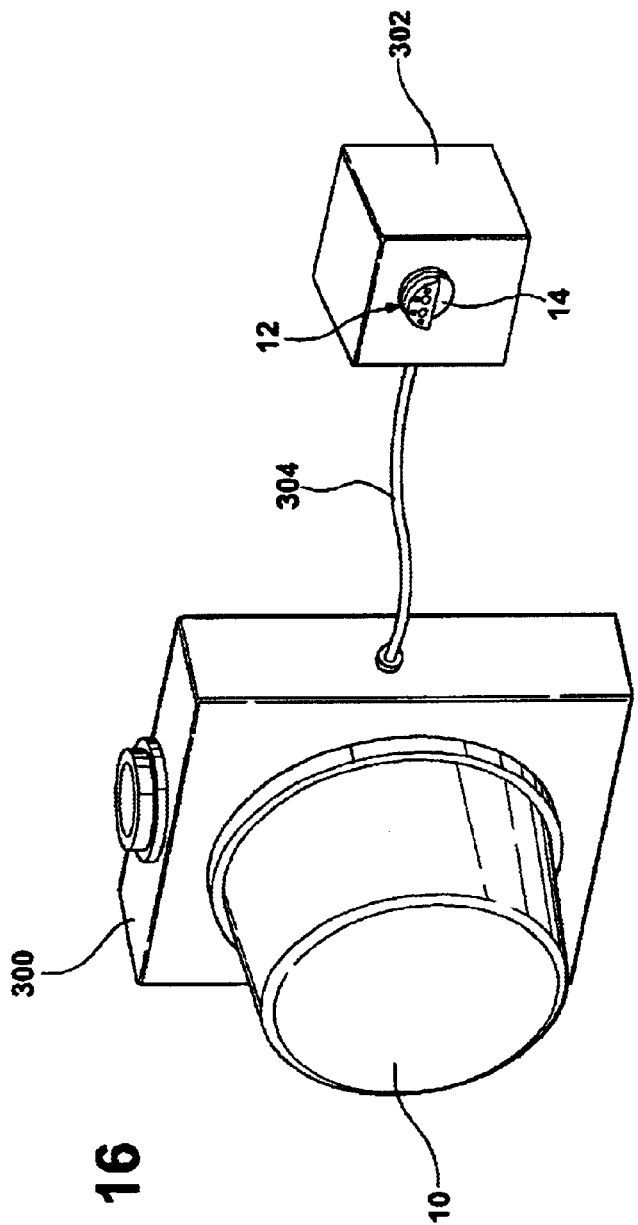
FIG. 16 is a perspective view of an alternate optical port mounting configuration on which the optical port seal of the present invention is mountable.

This broad application of the present optical port seal is illustrated in FIG. 16 wherein the watthour meter 10 is mounted in a conventional watthour meter socket 300. Although not shown, as is conventional, such a socket 300 will receive the utility power line conductors as well as the load distribution network power conductors. The line and load power conductors are connected to internal jaw contacts mounted within the socket 300, which jaw contacts receive the blade terminals of the watthour meter 10 in a conventional snap-in connection.

In this application, the cylindrical coupler 14 of the optical port 12 is mounted in a separate enclosure 302, which is located at any position, such as immediately adjacent to or spaced from the associated watthour meter socket 300. This mounting position is suitable for retrofitting existing meter applications with optical port communication. The outputs of the optical port 12 are connected through a conductor or cable 304 which runs from the auxiliary enclosure 302 to the watthour meter 10 or through a wall of the meter socket 300 to the watthour meter 10 to establish communication between the optical port coupler 14 and the watthour meter 10 in a conventional manner.

All of the optical port covers described above and forming a part of the present invention may be securely mountable about the optical port 12 mounted on the auxiliary enclosure 302 to cover and protect the optical port 12 in the same manner as described above and shown in FIGS. 1–15 for optical ports mounted on the dome of a watthour meter 10.

The cover of the present invention uniquely provides protection for the optical port on an electrical enclosure by protecting the optical port from damage, tampering and ultraviolet radiation. The cover can also receive a seal to provide a sealed indication of the cover on the optical port. At the same time, the cover can be easily attached to and removed from the optical port so as to prevent interference with the optical coupling between the optical coupler and the remote readers programmer adapter.

What is claimed is:

1. A seal for an optical port on an electrical enclosure, the optical port including a support projecting from the electrical enclosure, the support having a data communication end, the seal comprising:

a cap having a closed end portion adapted to be mountable over and encompass an optical port support on an electrical enclosure;

means for fixably securing the cap to the optical port support, with the closed end of the cap disclosed over the data communication end of the optical port support, the securing means including in part a fastener for tighteningly fixing the cap to the support; and means for indicating tampering with one of the cap securing means and the cap.

2. The seal of claim 1 wherein the securing means comprises:

a fastener threadingly extendable through the cap into fixed engagement with the optical port support.

3. The seal of claim 2 further comprising:

the cap having an end portion disposed over the optical port data communication end, a sidewall depending from the end portion, and at least one leg extending from the sidewall.

4. The seal of claim 2 wherein:
the fastener has a hardened tip.
5. The seal of claim 2 wherein:
the fastener has a conical tip.
6. The seal of claim 2 wherein:
the fastener has a cupped-shaped tip.
7. A seal for an optical port on an electrical enclosure, the optical port including a support projecting from the electrical enclosure, the support having a data communication end, the seal comprising:
a cap having a closed end portion adapted to be mountable over and encompass an optical port support on an electrical enclosure;
means for fixably securing the cap to the optical port support, with the closed end of the cap disclosed over the data communication end of the optical port support, the securing means including a fastener threadingly extendable through the cap into fixed engagement with the optical port support;
at least one leg projecting from the cap;
an aperture formed in at least one leg;
an aperture formed in the fastener; and
means, mountable through the apertures in the legs of the cap and the fastener, for indicating tampering with one of the cap and the support.
8. The seal of claim 7 wherein the at least one leg comprises:
two spaced legs, each having one aperture formed therein; and
the two legs disposed on opposite sides of the fastener.
9. A seal for an optical port on an electrical enclosure, the optical port including a support projecting from the electrical enclosure, the support having a data communication end, the seal comprising:
a cap having a closed end portion adapted to be mountable over and encompass an optical port support on an electrical enclosure;
means for fixably securing the cap to the optical port support, with the closed end of the cap disclosed over the data communication end of the optical port support;
an extension projecting from the closed end portion of the cap, the extension defining a wall portion terminating in a cross piece; and
an aperture formed in the cross piece aligned with an internally threaded bore formed in the closed end portion, the threaded bore receiving the securing means.
10. The seal of claim 9 wherein the cap further comprises:
a sidewall extending from the closed end portion; and
a shoulder formed interiorly within the sidewall defining a resilient gasket mounting surface for forming a seal between the cap and the watthour meter.
11. The seal of claim 10 further comprising:
a resilient seal mountable on the shoulder for sealing the cap to the watthour meter.
12. The seal of claim 10 wherein the shoulder defines a thinner sidewall portion on the sidewall extending from the shoulder, the thinner sidewall portion being more easily deformable than the portion of the sidewall extending oppositely from the shoulder.
13. The seal of claim 9 wherein the securing means comprises:
a fastener having a shaft with a threaded end portion threadingly engagable with the threads in the closed end portion of the cap; and
an aperture formed in the shaft for receiving a seal member when the fastener is mounted in the cap and the extension.
14. The seal of claim 9 wherein the cap further comprises:
an annular sidewall extending from the closed end portion; and
at least one radially inward projection formed on the sidewall and projecting into the interior of the cap, the projection deformably engagable with the optical port when the cap is mounted on the optical port.
15. The seal of claim 9 wherein the securing means comprises:
a fastener threadingly extendable into the threaded bore in the cap; and
finger grip surfaces formed on the fastener to facilitate hand rotation of the fastener.
16. The seal of claim 9 wherein the securing means comprises:
a fastener threadingly extendable into the threaded bore in the cap; and
an aperture formed in the fastener for receiving a tool to facilitate rotation of the fastener.
17. The seal of claim 9 wherein the securing means comprises:
a fastener threadingly extendable into the threaded bore in the cap; and
an end portion formed on the fastener having a plurality of angularly disposed exterior flats for receiving a tool to facilitate rotation of the fastener.
18. The seal of claim 9 wherein the securing means comprises:
a fastener threadingly extendable into the threaded bore in the cap; and
an end portion formed on the fastener having a plurality of interior flats opening through the end portion for receiving a tool interiorly within the end portion to facilitate rotation of the fastener.
19. The seal of claim 9 wherein the securing means comprises:
a fastener threadingly extendable into the threaded bore in the cap; and
an end portion formed on the fastener, the end portion having a slot extending transversely therethrough and opening through the end portion for receiving a tool to facilitate rotation of the fastener.
20. The seal of claim 9 wherein the securing means comprises:
a fastener having a tip end and a rotative force application end;
a threaded portion extending from the tip end for threading engagement with the threads in the cap; and
a plurality of circumferentially spaced legs connecting the threaded portion to the rotative force application end, the legs having a predetermined thickness such that the legs are deformable at a predetermined amount of rotative force applied to the rotative force application end.
21. A seal for an optical communication port on a utility meter type electrical enclosure, the optical port including a support projecting from the electrical enclosure, the support having a data communication end, the seal comprising:
an adhesive backed strip adapted to be mountable over a data communication end of the optical port support, the strip being formed to necessarily become permanently deformable upon removal from the data communication end of the optical port support to provide evidence of tampering.

22. A seal for an optical port on an electrical enclosure, the optical port including a support projecting from the electrical enclosure, the support having a data communication end, the seal comprising:

a cap having a closed end portion adapted to be mountable over and encompass an optical support on an electrical enclosure;

an extension projecting from the closed end portion of the cap, the extension defining a wall portion terminating in a cross piece;

an aperture formed in the flange aligned with an internally threaded bore in the closed end portion; and a fastener threadingly extendable through the aperture into the threaded bore into engagement with the optical support for fixedly securing the cap to the optical port support.

23. The seal of claim 22 wherein:

the fastener has a hardened tip adapted to engage the optical port support.

24. The seal of claim 22 wherein:

the fastener has a conical tip.

25. The seal of claim 22 wherein:

the fastener has a cupped-shaped tip.

26. The seal of claim 22 further comprising:

the fastener having a shaft with a threaded end portion threadingly engagable with the threads in the closed end portion of the cap; and an aperture formed in the shaft for receiving a seal member when the fastener is mounted in the cap.

27. The seal of claim 22 wherein the cap further comprises:

an annular sidewall extending from the closed end portion; and at least one radially inward projection formed on the sidewall and projecting into the interior of the cap, the projection deformably engagable with the optical port when the cap is mounted on the optical port.

28. The seal of claim 22 further comprising:

the fastener threadingly extendable into the threaded bore in the cap; and finger grip surfaces formed on the fastener to facilitate hand rotation of the fastener.

29. The seal of claim 22 further comprising:

an aperture formed in the fastener for receiving a tool to facilitate rotation of the fastener.

30. The seal of claim 22 further comprising:

an end portion formed on the fastener having a plurality of angularly disposed exterior flats for receiving a tool to facilitate rotation of the fastener.

31. The seal of claim 22 further comprising:

an end portion formed on the fastener having a plurality of interior flats opening through the end portion for receiving a tool interiorly within the end portion to facilitate rotation of the fastener.

32. The seal of claim 22 further comprising:

an end portion formed on the fastener, the end portion having a slot extending transversely therethrough and opening through the end portion for receiving a tool to facilitate rotation of the fastener.

33. The seal of claim 22 further comprising:

the fastener having a tip end and a rotative force application end;

a threaded portion extending from the tip end for threading engagement with the threads in the cap; and a plurality of circumferentially spaced legs connecting the threaded portion to the rotative force application end, the legs having a predetermined thickness such that the legs are deformable at a predetermined amount of rotative force applied to the rotative force application end.

* * * * *